(12) United States Patent
Wang et al.

(10) Patent No.: US 7,817,009 B2
(45) Date of Patent: Oct. 19, 2010

(54) LED APPARATUS WITH TEMPERATURE CONTROL FUNCTION

(75) Inventors: Shau Chew Wang, Taipei (TW); Jyh Ming Yu, Kaohsiung (TW)

(73) Assignee: Polytronics Technology Corp., Hsinchu (TW)

( * ) Notice: Subject to any disclaimer, the term of this patent is extended or adjusted under 35 U.S.C. 154(b) by 597 days.

(21) Appl. No.: 11/484,386

(22) Filed: Jul. 11, 2006

(65) Prior Publication Data

US 2007/0139928 A1   Jun. 21, 2007

(30) Foreign Application Priority Data

Dec. 27, 2005   (TW) ............... 94146663 A

(51) Int. Cl.
*H01C 3/04* (2006.01)
(52) U.S. Cl. .................... 338/25; 362/253; 362/276; 315/309
(58) Field of Classification Search ............ 338/25; 362/253, 276; 315/309
See application file for complete search history.

(56) References Cited

U.S. PATENT DOCUMENTS 6,487,084 B1   11/2002   Chu et al.

2006/0012997 A1*   1/2006   Catalano et al. ............ 362/253
2007/0121326 A1*   5/2007   Nall et al. .................. 362/294

FOREIGN PATENT DOCUMENTS

CN   2479709 Y   2/2002
JP   7106635   4/1995

* cited by examiner

*Primary Examiner*—Anh T Mai
*Assistant Examiner*—Joselito Baisa
(74) *Attorney, Agent, or Firm*—Seyfarth Shaw LLP

(57) ABSTRACT

An LED apparatus with temperature self-regulating, over-temperature protection, and over-current protection function comprises an LED chip, a heat dissipation plate, a heat conductive layer and a temperature control device. The heat dissipation and the heat conductive layer disposed thereon carry the LED chip and dissipate the heat generated from the LED chip that is connected to an electric power source for luminance. The temperature control device exhibiting PTC behavior is electrically connected between the LED chip and the electric power source in series, and the distance between the LED chip and the temperature control device is less than 3 cm. The heat conductive layer can consist of polymeric dielectric material and has a heat conduction coefficient larger than 1.0 W/mK at 25° C.

13 Claims, 5 Drawing Sheets

LED APPARATUS WITH TEMPERATURE CONTROL FUNCTION

BACKGROUND OF THE INVENTION (A) Field of the Invention

The present invention is related to an LED (light emitting diode) apparatus, more specifically, to an LED apparatus having temperature control functions.

(B) Description of the Related Art

In recent years, white light LED is an attractive new product with increasing importance around the world. It has the advantages of small volume, low power consumption, long lifetime and quick response, and can solve many problems that exist with an incandescent lamp.

In view of the consensus of Japan, European countries, and the U.S. on power saving and environmental protection, the countries are actively developing white light LED as the luminance source for this century. In addition, if all incandescent lamps are replaced with white light LEDs, electric power consumption can be diminished and carbon dioxide ($CO_2$) generation can be decreased so as to reduce the greenhouse effect. Accordingly, European countries, the U.S. and Japan are investing manpower on R&D, and white light LED is predicted to replace conventional lamp technology within ten years.

Current LED apparatus for luminance may integrate plural LEDs as an illuminant module, or use so-called large chip process. However, regardless of the arrangement in use, the tiny LED package has to effectively dissipate high heat, otherwise product reliability issues may arise due to the different expansion coefficients of the LED package materials, and the illuminant efficiency will significantly decrease as the temperature goes up. The LED apparatus' lifetime is reduced by high temperatures as well. Therefore, ability to avoid destructive high heat while illuminating becomes important for LED applications.

It is obvious that LED apparatus should incorporate a design for heat dissipation. One design solution is to use a metal leadframe below the LED chip to dissipate the heat generated from the LED. However, in order to improve the brightness, a high efficiency LED using a light source consisting of plural LEDs or large chip still suffers poor heat dissipation efficiency. Another design solution is to use temperature or current control IC to control the input current to LED. However, not only the IC solution is an expensive solution, but also the IC itself generates heat and has heat dissipation problem. The IC solution needs additional heat dissipation mechanism to achieve a better heat management for LED. It is most desirable that a self-regulating and temperature sensing device, such as PTC, should be incorporated into the IC controlled LED system.

SUMMARY OF THE INVENTION

The objective of the present invention is to provide an LED apparatus having temperature control functions such as over-temperature protection or temperature adjustment. The current flowing through the LED can be significantly decreased whenever the temperature of the LED is too high or exceeds a threshold value, thereby rapidly decreasing the heat generation so as to prevent the LED from being damaged. Alternatively, the current flowing through the LED can be promptly decreased when temperature of the LED start to increase, so that the temperature of the LED can not exceed the threshold value.

The resistance of a positive temperature coefficient (PTC) device is sensitive to temperature variation and can be kept extremely low during normal operation so that the circuit can operate normally. However, if an over-current or an over-temperature event occurs, the resistance will immediately increase to a high resistance "switching" state (also known as "trip" state) to protect the circuit.

According to one aspect of the present invention, the PTC device serves for over-current circuit protection. In an electric circuit, many incidents, such as hot plug, on-off switch, power surge, etc., could bring in-rush current to the system. Under the over-current condition, the PTC device switches to high resistance state. Thus, the in-rush current could be eliminated and the protection of the LED circuit could be achieved.

According to another aspect of the present invention, the PTC device could also be used for LED over-temperature protection based on its inherent temperature sensing characteristics and its abrupt increase of resistance when temperature exceeds its switching temperature. The switching temperature is defined as the temperature at which PTC resistance raises to 10 times of its initial room temperature resistance. Once PTC senses the heat build-up around LED to a dangerous level, the PTC switches to a high resistance state and rapidly drops the input current to a very low level. This current limiting behavior of PTC is especially useful for preventing LED from thermal-run-away.

Moreover, according to the present invention, the PTC device provides LED with a self-regulating function on current and temperature when temperature is below the switching temperature of the PTC device. As the LED temperature gets higher, the resistance of PTC raises to higher level and the current drops to a lower level which results in the reduction of electrical power input to the LED. Consequently, the LED temperature cools back down to its normal operating temperature. From another aspect, as the LED temperature gets lower, the PTC resistance drifts to a lower level and the electrical current rises to a higher level which causes higher electrical power input to the LED. Thus, the LED is heated up to a higher temperature level. The LED temperature could be automatically adjusted by the LED heating and cooling mechanism which is resulting from the increase and decrease of the input current controlled by PTC. Therefore, the PTC device provides a self-regulating temperature control and current limiting function for LED.

In order to achieve the above objective, an LED apparatus with temperature control function is disclosed. The LED apparatus uses the temperature-sensitive PTC device as a temperature sensing and control device, so as to protect the LED.

The PTC device could be prepared from either a ceramic material or a polymeric material. The switching temperature of commercially available ceramic PTC is around 100° C. to 300° C., and the switching temperature of the market available polymeric PTC, which is governed by the melting temperature or the glass transition temperature of the polymer, is around 70° C. to 280° C. Depending on the distance between LED and PTC, the junction temperature of LED, and the thermal conductivity in the system, the switching temperature of PTC is most preferably designed between 80° C. and 180° C. For instance, if a temperature sensing PTC device is placed very close to the LED, the PTC could be selected to have a switching temperature close to the LED junction temperature (e.g., 160° C.). And, if a temperature sensing PTC device is placed at a certain distance away from the LED and the conduction of heat to PTC results in much lower PTC sensing temperature than the LED junction temperature, the PTC should have a switching temperature much lower than the LED junction temperature.

The LED apparatus of the present invention comprises at a minimum an LED chip, a heat dissipation plate and a temperature control device. The heat dissipation plate carries the LED chip, and dissipates the heat generated from the LED chip when the LED chip is connected to an electric power source to illuminate. The temperature control device exhibits PTC behavior and is electrically connected between the LED chip and the electric power source in series. In addition, the distance between the temperature control device and the LED chip is less than 3 centimeters so as to effectively sense the temperature of the LED chip.

Moreover, to resolve problems of electrical short or different expansion coefficients occurring between the LED chip and the heat dissipation plate, a heat conductive layer can be formed between the heat dissipation plate and the LED chip. The heat conductive layer can consist of polymeric dielectric material and has a heat conductive coefficient larger than 1.0 W/mK at 25° C.

The above-mentioned LED apparatus can be further equipped with a first electrode and a second electrode for connection to an electric power source after packaging. In accordance with the first embodiment, the first electrode is connected to an electrode of a first conductive type, e.g., p-electrode, of the LED chip, and the temperature control device is electrically connected in series between an electrode of a second conductive type, e.g., n-electrode, of the LED chip and the second electrode. The first and second electrodes can be formed on the surfaces of the polymeric heat conductive layer.

The heat conductive layer is made by blending polymer and at least one high heat conductive dielectric filler with greater than 40% volume ratio and followed by pressing. Because polymer is easy to be treated and processed in comparison with other metallic or ceramic materials and is dielectric, it is suitable for use as the matrix of the heat conductive layer. Almost all polymers can be used for this application and not limited to the following materials: rubber (e.g., natural rubber, silicone, isobutylene rubber, SBS, or liquid rubber CTBN), thermoset resins (e.g., epoxy, polyurethane or polyester) or thermoplastic resins (e.g., polyethylene, polyvinyodene fluoride, polypropylene, Nylon, polyester, ABS or copolymer thereof). In order to increase mechanical strength and stability at high temperature of the thermoplastic resins, the thermoplastic resins can be further subjected to a cross-linking process such as radiation or addition of a chemical cross-linking agent. The thermoset resins can comprise functional groups such as amine, acid, anhydride, isocyanate, halogen, alcohol and epoxide.

The high heat conductive dielectric filler can be selected from the material having a heat conductive coefficient higher larger than 1.0 W/mK, preferably larger than 5.0 W/mK and most preferably larger than 10 W/mK, at 25° C. The volumetric resistivity of the high heat conductive dielectric filler is larger than $10^8$ Ω-cm, preferably larger than $10^{10}$ Ω-cm, and most preferably larger than $10^{12}$ Ω-cm. The volumetric ratio of the high heat conductive dielectric filler in the conductive layer is between 20% and 90%, preferably between 30% and 80%, and most preferably between 40% and 70%. The heat conductive layer exhibits higher thermal conductivity if more high heat conductive dielectric filler is contained therein. The high heat conductive dielectric filler usually uses metallic nitride, e.g., aluminum nitride, boron nitride. Others such as metallic oxide, metallic boride, metallic salt, metallic carbide, silicon compound and graphite also can be served as high heat conductive dielectric filler. In addition, for some special purposes, an anti-oxidization agent and desiccant may be added as long as the heat conductive layer still has heat dissipation capability, e.g., the heat conductive coefficient is greater than 1.0 W/mK.

Moreover, the high thermal conductive dielectric filler can have the form of powder with various crystalline structures or shapes such as spherical, cubic, hexagonal, flake, multi-angle, spiky, rod, coral, nodular or filament shapes. The size of the powder is mainly between 0.01 and 30 µm, and preferably between 0.1 and 10 µm, and the aspect ratio is mainly less than 100.

The temperature control device comprises two electrode foils and a temperature sensitive layer laminated therebetween. The polymeric temperature sensitive layer exhibits PTC behavior and comprises crystalline polymer or blend of crystalline polymers, and electrical conductive filler. The switching temperature, which is governed by the melting temperature of crystalline polymer, ranges from 45° C. to 300° C., preferably from 60° C. to 250° C., most preferably from 80° C. to 180° C. The two electrode foils are used to electrically connect to the LED chip and the second electrode. Moreover, one of the electrode foils can be separated into two foil members, which are positioned at the same side of the temperature sensitive layer, for electrical connection. Accordingly, the electrode foils at the same side or at different sides can be selected for electrical connection, thus the manufacture is more flexible.

DETAILED DESCRIPTION OF THE INVENTION

The present invention will be explained with the appended drawings to clearly disclose the technical characteristics of the present invention.

Figure 1:
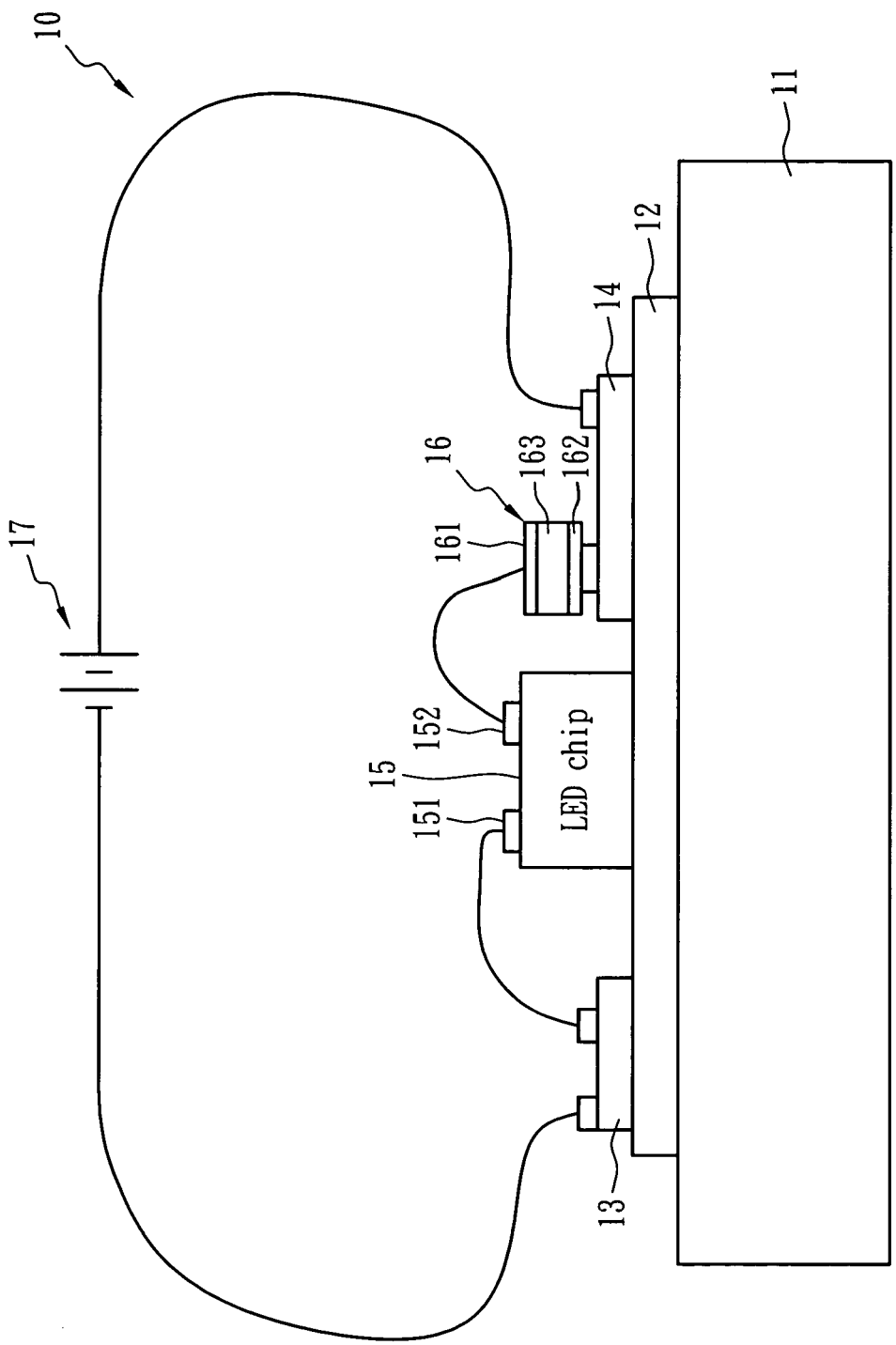
FIG. 1 illustrates an LED apparatus with temperature control function in accordance with the present invention.

FIG. 1 illustrates an LED apparatus with temperature control function in accordance with an embodiment of the present invention. An LED apparatus 10 comprises a heat dissipation plate 11, a heat conductive layer 12, a first electrode 13, a second electrode 14, an LED chip 15 and a temperature control device 16. The LED chip 15, the first electrode 13 and the second electrode 14 are disposed on a side of the heat conductive layer 12, and the other side of the heat conductive layer 12 is in contact with the heat dissipation plate 11 so as to dissipate the heat of the LED chip 15. In short, the heat conductive layer 12 and heat dissipation plate 11 are used for carrying the LED chip 15 and for heat dissipation while the LED chip 15 illuminates.

The distance between the temperature control device 16 and the LED chip 15 is less than 10 cm, and preferably less than 6 cm, and most preferably less than 3 cm, so as to effectively sense the temperature of the LED chip 15. The distance between the temperature control device 16 and the LED chip 15 would be changed according to the climates at different places; the distance is shorter for low temperature areas and longer for high temperature areas.

The heat dissipation plate 11 is made of material with a high heat conductive coefficient such as aluminum, copper or ceramic. However, the thermal expansion coefficients of such materials and the LED chip 15 are significantly different. If they directly contact each other, the stress due to temperature increase may induce reliability problems. Therefore, the heat conductive layer 12 of adequate conductive coefficient and expansion coefficient is introduced between the LED chip 15 and the heat dissipation plate 11. The heat conductive layer 12 may consist of polymeric dielectric material of high thermal conductive coefficient.

The LED chip 15 has a p-electrode 151 connected to the first electrode 13, and an n-electrode 152 connected to the second electrode 14 with a temperature control device 16 in series connection therebetween. The first electrode 13 and the second electrode 14 are respectively electrically connected to a negative terminal and a positive terminal of a electric power source 17. The temperature control device 16 is disposed on a surface of the second electrode 14 and is constituted of a temperature sensitive layer 163 laminated between electrode foils 161 and 162. The electrode foil 161 is connected to the n-electrode 152 of the LED chip 15, and the electrode foil 162 is connected to the second electrode 14.

Figure 2:
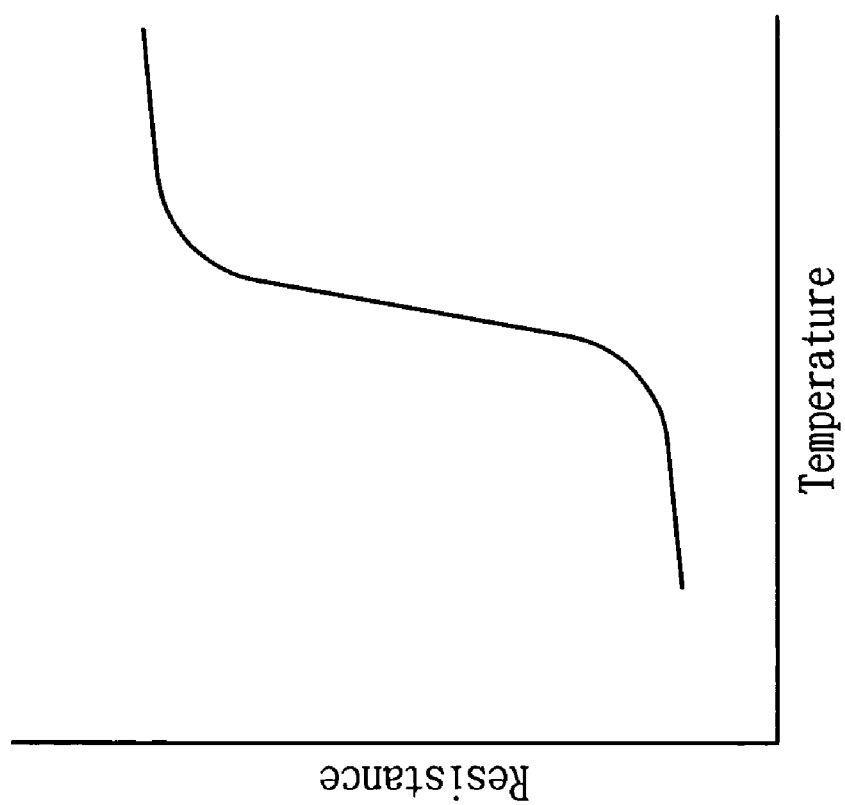
FIG. 2 illustrates the relation between temperature and resistance of PTC material.

The temperature sensitive layer 163 can include PTC polymer, e.g., the temperature control circuit 16 is a PTC device. When temperature exceeds the trip temperature of the PTC device, the resistance will increase immediately as shown in FIG. 2. Accordingly, the current flowing through the LED chip 15 in series connection to the PTC device decreases rapidly, thus the heat generated from the LED chip will significantly decrease, thereby avoiding damage to the LED chip due to over-temperature. When temperature is below the switching temperature of the PTC device as shown in FIG. 2, the PTC resistance will gradually increase with temperature. As the LED temperature gets higher, the resistance of PTC raises to higher level and the current drops to a lower level which results in the reduction of electrical power input to the LED. Consequently, the LED temperature cools back down to its normal operating temperature. From another aspect, as the LED temperature gets lower, the PTC resistance drifts to a lower level and the electrical current rises to a higher level which causes higher electrical power input to the LED. Thus, the LED is heated up to a higher temperature level. The LED temperature could be automatically adjusted by the LED heating and cooling mechanism which is resulting from the increase and decrease of the input current controlled by PTC. Therefore, the PTC device provides LED circuits with an analogue current control which results in a self-regulating temperature control of the LED. In this embodiment, the temperature sensitive layer 163 comprises at least one crystalline polymer of a melting point between 80 to 180° C. and conductive filler such as carbon black.

Figure 3:
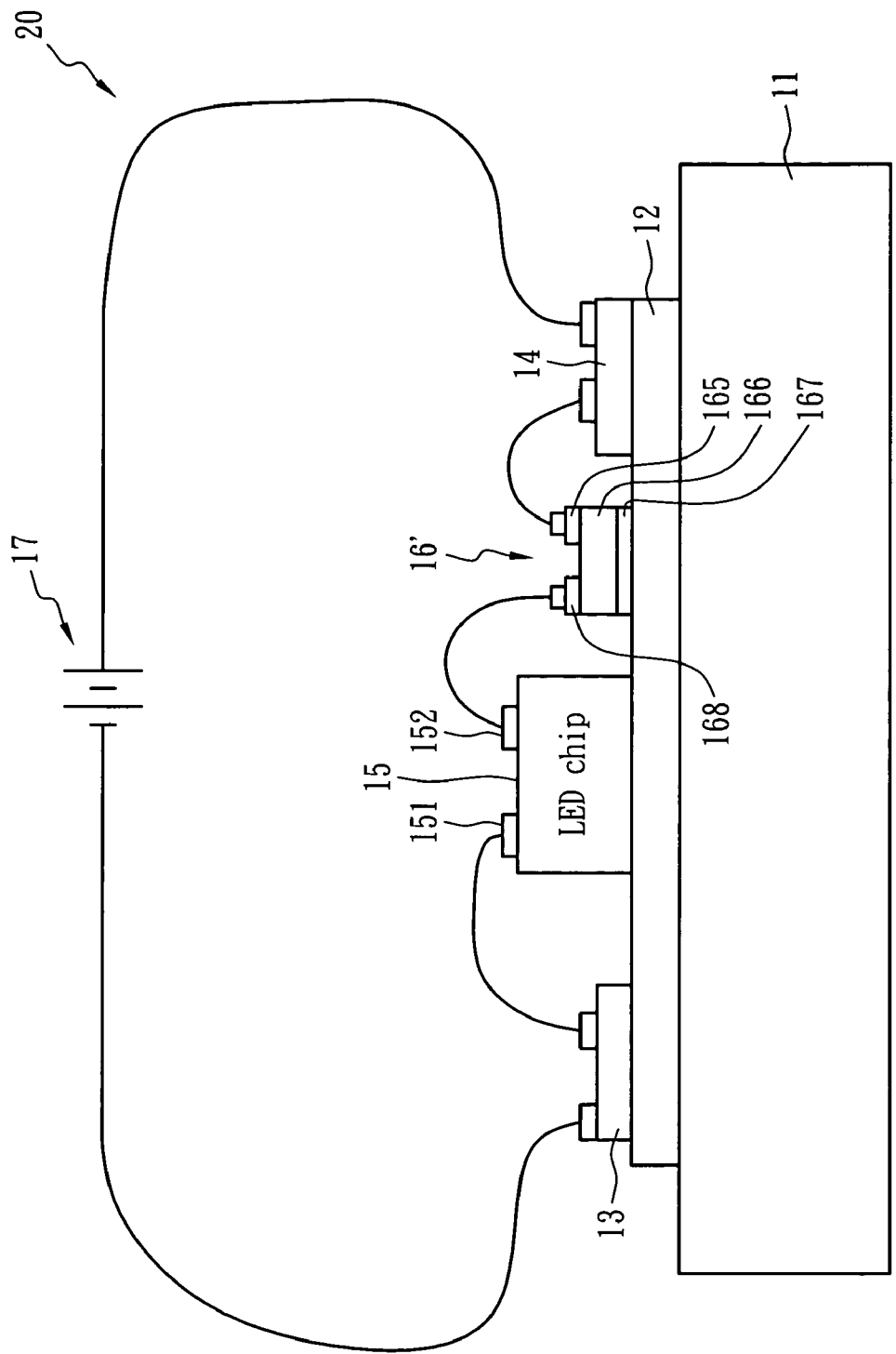
FIG. 3 illustrates another LED apparatus with temperature control function in accordance with the present invention.

FIG. 3 illustrates the LED apparatus with temperature control function in accordance with the second embodiment of the present invention. Like the LED apparatus 10 of the first embodiment, the LED apparatus 20 of the second embodiment comprises the heat dissipation plate 11, the heat conductive layer 12, the first electrode 13, the second electrode 14, the LED chip 15 and a temperature control device 16', but the temperature control device 16' is directly disposed on a surface of the heat conductive layer 12 instead of the second electrode 14. The temperature control device 16' is formed by laminating a temperature sensitive layer 166 between electrode foil members 168, 165 and an electrode foil 167. The electrode foil members 168 and 165 are disposed on a side of the temperature sensitive layer 166, whereas the electrode foil 167 is disposed on the other side of the temperature sensitive layer 166. The electrode foil member 168 is connected to n-electrode 152 of the LED chip 15, and the electrode foil member 165 is connected to the second electrode 14 which is connected to the positive terminal of the electric power source 17, thereby the temperature control device 16' is in series connection to the LED chip 15. Alternatively, the temperature control device 16' can be either connected between the second electrode 14 and the electric power source 17 or adhered to the bottom of the LED chip 15 and connected to the second electrode 14 as long as the temperature control device 16' can effectively sense the temperature of the LED chip 15.

By series connection of the LED chip 15 and the temperature control device 16 or 16', the current flowing through the LED chip 15 decreases when temperature increases, so that the brightness of the LED chip 15 will be lower. Accordingly, the temperature of the LED chip 15 becomes lower due to the lower heat generation caused by lower current. As a result, the heat absorbed by the temperature control device 16 or 16' decreases and the temperature control device 16 or 16' returns to a state of low resistance, such that the current flowing through the LED chip 15 resumes a normal level and the brightness of the LED chip 15 returns to standard.

Therefore, the LED apparatus of the present invention can be used as a device of intermittently bright and dim luminance. For example, a decoration illuminant device for adjusting indoor atmosphere, or an illuminant device of automatic brightness adjustment, which is dim during daytime with higher temperature and is bright at night with lower temperature.

Figure 4:
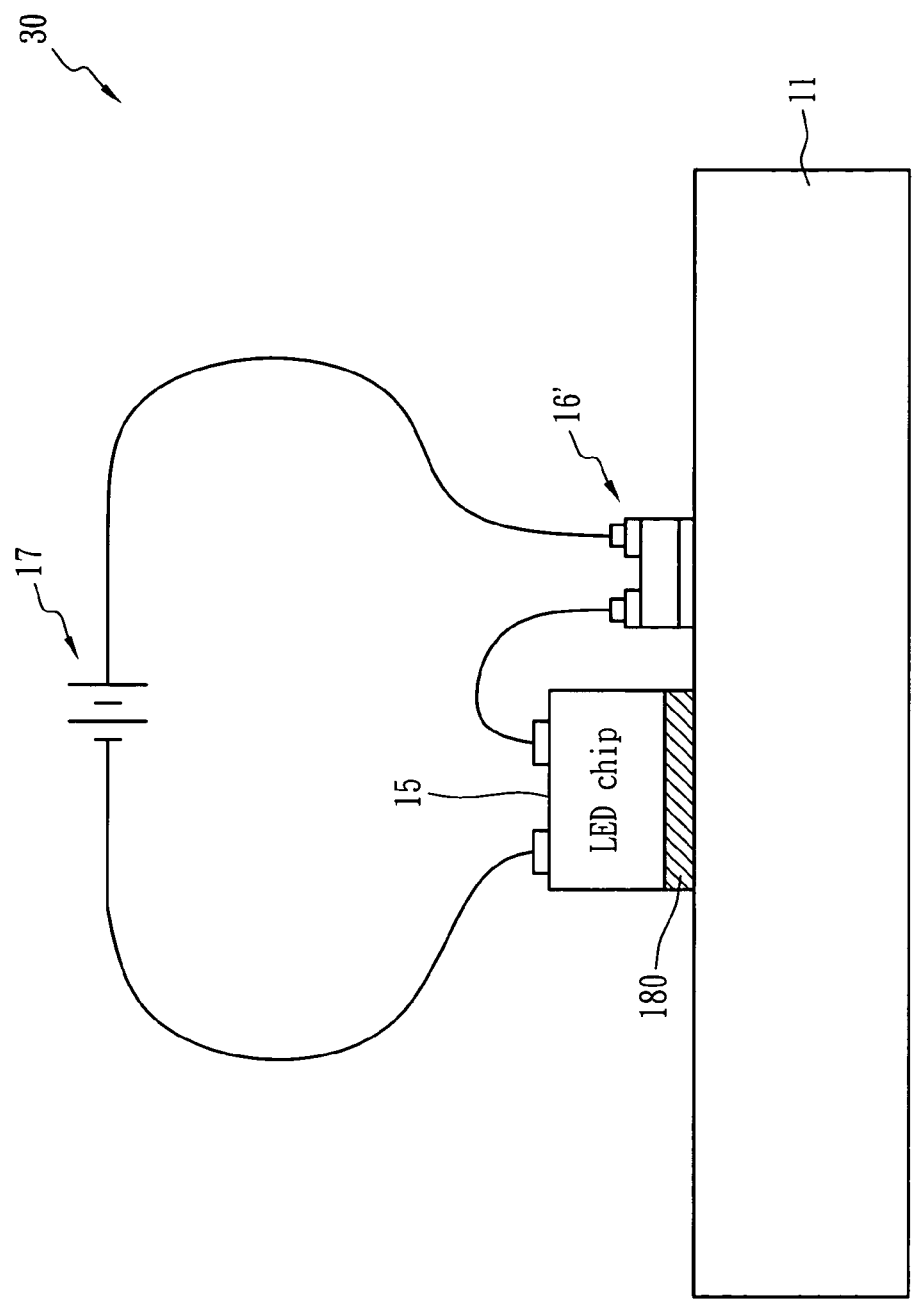
FIG. 4 illustrates one more LED apparatus with temperature control function in accordance with the present invention.

In addition, the LED chip 15 and the temperature control device 16' can be directly adhered to the heat dissipation plate 11 by heat conductive paste 180, omitting the heat conductive layer 12, so as to form another LED apparatus 30 with temperature control function as shown in FIG. 4, in which the electrodes for connection to an electric power source after packaging is omitted.

In practice, the LED apparatus of the present invention has an over temperature protection function. When the temperature approaches the switching temperature of the temperature control device, the resistance of the temperature control device drastically increases and thus the current flowing through the LED chip sharply decreases, so that the heat generated from the LED chip can be efficaciously reduced. Consequently, the danger of thermal-run-away of the LED apparatus can be eliminated.

If the temperature control device is well controlled to be of a temperature below the trip temperature, the LED apparatus of the present invention is controlled by the PTC temperature self-regulating function. In this temperature self-regulating mode, the LED chip only slightly decreases or increase the brightness while PTC regulating the input current. The brightness variation is not easily identified by human eyes, and always has enough brightness for luminance.

Figure 5:
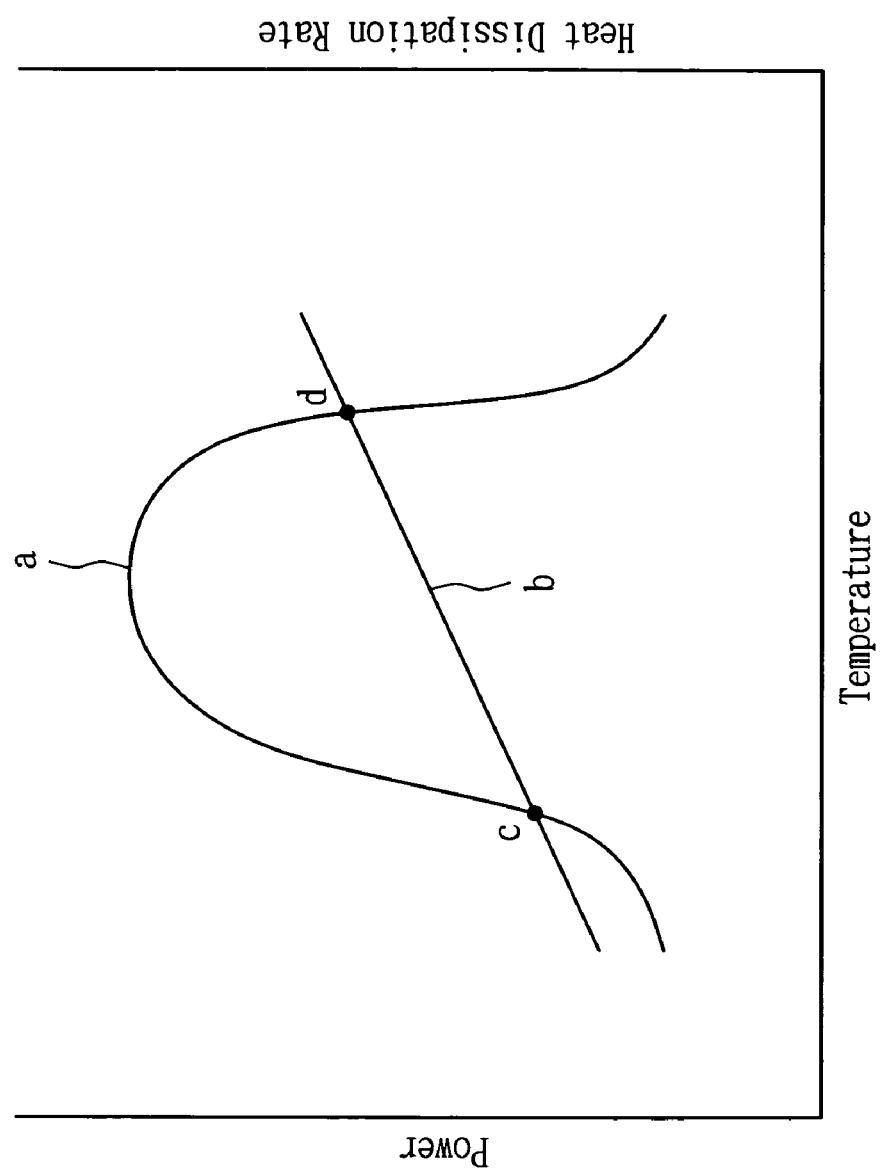
FIG. 5 is a heat dissipation diagram of the LED apparatus with temperature control function in accordance with the present invention.

As shown in FIG. 5, the input energy from electric power and the output energy due to heat dissipation in relation to the temperature of the PTC and LED apparatus of the present invention are illustrated. The LED apparatus could also comprise any heat source, such as control IC, in electrical connection with LED. The curve "a" shows the relation between the input power and the temperature, and the straight line "b" indicates the heat dissipation rate. Since PTC and LED are in series, a constant electric current flows through both devices. Because power is proportional to the square of current, the curve "a" of power increases exponentially as the current of the PTC and LED chip increases, and decreases exponentially as the PTC switched to high resistance state and thus the current of the PTC and LED chip decreases. When the temperature of the LED chip is higher, the heat dissipation rate is faster due to larger temperature differences corresponding to the environment, as shown in straight line "b."

In accordance with the heat dissipation equation $$mc_p \frac{dT}{dt} = I^2 R - k(T - T_0),$$

in which m is the mass of the temperature sensitive layer of the temperature control device, $c_p$ is the specific heat capacity of the temperature sensitive layer of the temperature control device, T is the temperature of the temperature sensitive layer of the temperature control device, t is time, I is current, R is resistance, k is heat conductive coefficient, $T_0$ is environment temperature. When the heat generation rate of the temperature sensitive layer of the temperature control device is equal to the heat dissipation rate of the same, i.e., under heat equilibrium, $$\frac{dT}{dt} = 0, \text{ so } I^2 R = k(T - T_0),$$

such condition occurs at the intersections "c" and "d" of the curve "a" and the straight line "b." The temperature at intersection "c" is lower than the switching temperature of the temperature control device, and the temperature of the intersection "d" is higher than the switching temperature. Since PTC real-time regulates the current, the PTC and LED apparatus combination could reach a thermal equilibrium point, i.e., at the intersection "c" shown in FIG. 5. The PTC sensed equilibrium temperature of the LED apparatus could always be lower than the switching temperature. In other words, the LED and PTC combination in use generates a temperature self-regulating function, so as to avoid damage due to high temperature.

The LED apparatus of the present invention can provide protection for white light LED use in the future, and prevent the LED from being damaged by an automatic temperature decreasing mechanism.

The above-described embodiments of the present invention are intended to be illustrative only. Numerous alternative embodiments may be devised by those skilled in the art without departing from the scope of the following claims.

What is claimed is:

1. A light emitting diode (LED) apparatus with temperature control function, comprising:
   at least one LED chip;
   at least one heat dissipation plate carrying the LED chip and dissipating heat of the LED chip when the LED chip is connected to an electric power source;
   at least one temperature control device exhibiting positive temperature coefficient (PTC) behavior and being electrically connected in series between the LED chip and the electric power source, and having a distance from the LED chip less than 3 centimeters; and
   at least one heat conductive layer comprising polymeric dielectric material being laminated between the heat dissipation plate and the LED chip, and the heat conductive layer having a heat conductive coefficient larger than 1.0 W/mK at 25° C.;
   wherein the at least one temperature control device directly self-regulates a current flowing through the LED chip without associating with a control IC.

2. The LED apparatus with temperature control function of claim 1, wherein the switching temperature of the temperature control device is between 80 to 180° C.

3. The LED apparatus with temperature control function of claim 1, further comprising:
   a first electrode connected to an electrode having a first conductive type of the LED chip and electrically connected to the electric power source; and
   a second electrode connected to the temperature control device and electrically connected to the electric power source;
   wherein the temperature control device is connected to an electrode having a second conductive type of the LED chip.

4. The LED apparatus with temperature control function of claim 3, wherein the first electrode and the second electrode are disposed on a surface of the heat conductive layer.

5. The LED apparatus with temperature control function of claim 3, wherein the temperature control device comprises:
   a first electrode foil;
   a second electrode foil; and
   a temperature sensitive layer comprising PTC material and electrically conductive fillers, and being laminated between the first electrode foil and the second electrode foil.

6. The LED apparatus with temperature control function of claim 5, wherein the first electrode foil is connected to the electrode having the second conductive type of the LED chip, and the second electrode foil is connected to the second electrode.

7. The LED apparatus with temperature control function of claim 5, wherein the first electrode foil comprises two electrically separated electrode foil members, one of the two electrode foil members is connected to the electrode having the second conductive type of the LED chip, and the other electrode foil member is connected to the second electrode.

8. The LED apparatus with temperature control function of claim 5, wherein the PTC material consists of crystalline polymer or ceramic.

9. The LED apparatus with temperature control function of claim 1, wherein the temperature of the temperature control device is lower than the switching temperature of the PTC behavior when the LED chip is connected to the electric power source.

10. The LED apparatus with temperature control function of claim 1, wherein the LED chip is adhered to a surface of the heat dissipation plate by heat conductive paste.

11. The LED apparatus with temperature control function of claim 1, wherein the LED chip illuminates white light.

12. The LED apparatus with temperature control function of claim 1, wherein the temperature control device is disposed immediately adjacent the LED chip.

13. The LED apparatus with temperature control function of claim 1, wherein the temperature control device is connected to the LED chip by wire-bonding.

* * * * *